United States Patent
Gall et al.

(10) Patent No.: US 6,625,065 B2
(45) Date of Patent: Sep. 23, 2003

(54) METHOD FOR MASKING DQ BITS

(75) Inventors: Martin Gall, München (DE); Andre Schaefer, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/978,399

(22) Filed: Oct. 16, 2001

(65) Prior Publication Data

US 2002/0076872 A1 Jun. 20, 2002

(30) Foreign Application Priority Data

Oct. 16, 2000 (DE) .......................... 100 51 164

(51) Int. Cl.7 ................................................. G11C 7/00
(52) U.S. Cl. ............................. 365/189.01; 365/189.11; 365/196; 365/195
(58) Field of Search ............................ 365/195, 196, 365/189.01, 189.11; 326/60, 59

(56) References Cited

U.S. PATENT DOCUMENTS 4,291,221 A * 9/1981 Muehlbauer et al. ......... 377/44

FOREIGN PATENT DOCUMENTS

| DE | 27 53 607 | 6/1978 |
| DE | 28 28 822 | 1/1980 |

* cited by examiner

Primary Examiner—Richard Elms
Assistant Examiner—Jung H. Hur
(74) Attorney, Agent, or Firm—Lawrence A. Greenberg; Werner H. Stemer; Gregory L. Mayback

(57) ABSTRACT

A method for masking DQ bits that are input into a semiconductor memory by a memory controller is described. In this case, the bits to be masked are provided with an increased level and therefore cannot be read into the semiconductor memory due to the increased voltage level which functions as a deactivating voltage level.

6 Claims, 1 Drawing Sheet

METHOD FOR MASKING DQ BITS

BACKGROUND OF THE INVENTION

Field of the Invention

The present invention relates to a method for masking DQ bits (data bits) that are input into a semiconductor memory by a memory controller.

In contemporary memory bus systems, during so-called burst writing, bits that are transmitted but are not to be read into the memory, such as a DRAM for example, are prevented from being read in by activation of an additional DQM terminal or pin. Data bits constitute an example of such bits that are not to be read into the DRAM.

In a memory controller, a DQ signal and a DQM signal are generated by a DQ logic unit and by a DQM logic unit, respectively. The DQ signal containing bits n−2, n−1, . . . , n+3, n+4 passes from the DQ logic unit via a driver to a DRAM receiver. The DQM signal is also fed to the DRAM receiver via a driver.

The DQM signal has a high level and a low level. If the DQM signal assumes its low level between two instants of time, then the bits n+1, n+2, n+3 of the DQ signal are masked at the same time as the low level in the DRAM receiver. The masked bits n+1, n+2, n+3 do not pass to a dynamic random access memory (DRAM) connected downstream of the DRAM receiver.

In this known method, then, the DQ signal and the DQM signal are transmitted by the memory controller externally to the DRAM or the DRAM receiver. As a result, the temporal coordination of the DQ and DQM signal is extremely critical and susceptible to changes in the line routing on a printed circuit board ("PCB routing") and also jitter phenomena (voltage fluctuations, CLK or clock instabilities).

Moreover, it should be noted that the line routing for the DQM signal requires additional space and this line routing must be coordinated extremely accurately with the line routing for the DQ signal. In other words, the respective line lengths to be routed for the two signals and must be complied with exactly. All this leads to major problems in modules containing a plurality of DRAMs with a high packing density.

Finally, it should also be considered that additional pins are required in the DRAM receiver for the DQM signal, corresponding connectors in the module being made complicated as a result of this.

SUMMARY OF THE INVENTION

It is accordingly an object of the invention to provide a method for masking DQ bits which overcomes the above-mentioned disadvantages of the prior art methods of this general type, which can be employed especially for increasing packing densities of memory modules and at high clock frequencies and largely eliminates routing problems.

With the foregoing and other objects in view there is provided, in accordance with the invention, a method for masking DQ bits that are input into a semiconductor memory by a memory controller. The method includes changing a voltage level of the DQ bits to be masked, during a time window, from a normal voltage level to a deactivating voltage level which deviates from the normal level. The DQ bits having the deactivating voltage level, are masked DQ bits and are not read into the semiconductor memory.

In the case of the method of the type mentioned in the introduction, the object is achieved according to the invention by virtue of the fact that the DQ bits to be masked are fed to the semiconductor memory with a changed, in particular increased, voltage level relative to unmasked DQ bits.

The method according to the invention thus introduces for the DQ bits a changed, preferably increased, masking voltage level. If the DQ bits or the DQ signal are or is at the changed or increased voltage level, then the corresponding bits are masked. Therefore, at a DRAM receiver only one terminal is required for the DQ signal or for setting the masking thereof. Thus, a considerable amount of space is saved, which results in a great advantage for the construction of the module.

Problems on account of erroneous co-ordination or a lack of coordination between the DQ signal and the DQM signal are largely avoided since the setting to the normal or increased voltage level for the DQ signal is already performed in a driver logic unit in the memory controller. The short signal paths also largely preclude time-critical problems on account of routing on a printed circuit board and also jitter phenomena and clock instabilities.

In accordance with an added mode of the invention, there is the step of using a dynamic random access memory as the semiconductor memory and the DQ bits are input into the dynamic random access memory.

In accordance with another mode of the invention, there is the step of generating the DQ bits with the deactivating voltage level relative to unmasked DQ bits in a driver circuit with a driver logic unit.

In accordance with a further mode of the invention, there is the step of providing the driver circuit and the driver logic unit in the memory controller.

Other features which are considered as characteristic for the invention are set forth in the appended claims.

Although the invention is illustrated and described herein as embodied in a method for masking DQ bits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
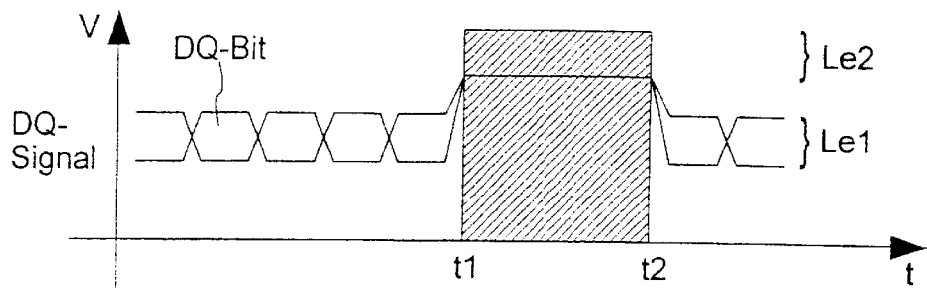
FIG. 1 is a diagrammatic illustration of a timing profile of DQ bits in a method according to the invention.

In all the figures of the drawing, sub-features and integral parts that correspond to one another bear the same reference symbol in each case. Referring now to the figures of the drawing in detail and first, particularly, to FIGS. 3 and 4 thereof, there is shown an operation which is referred to as the masking of bits.

In a memory controller MEMC, a DQ (data) signal DQ and a DQM (masked data) signal DQM are generated by a DQ logic unit DQL and by a DQM logic unit DRML, respectively. The DQ signal DQ containing bits n−2, n−1, ..., n+3, n+4 passes from the DQ logic unit DQL via a driver DRV1 to a DRAM receiver DR. The DQM signal DQM is also fed to the DRAM receiver DR via a driver DRV2.

Figure 3:
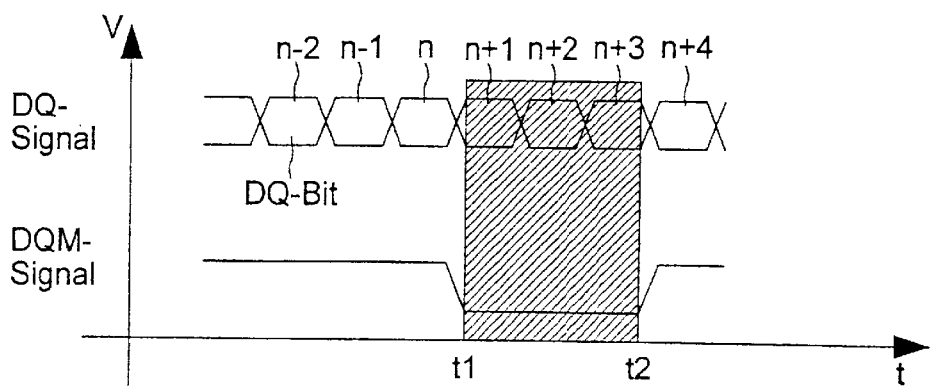
FIG. 3 is a diagrammatic illustration of the timing profile of the DQ bits and of a DQM signal in a prior art method for masking the DQ bits.
Figure 4:
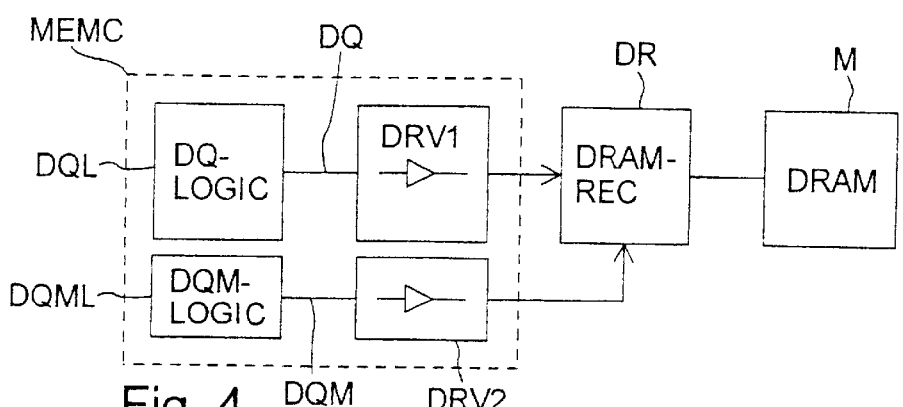
FIG. 4 is a block diagram of a circuit configuration for carrying out the known method.

The DQM signal DQM has a high level and a low level, as can be seen from FIG. 3. If the DQM signal DQM assumes its low level between two instants t1 and t2, then the bits n+1, n+2, n+3 of the DQ signal DQ are masked at the same time as the low level in the DRAM receiver DR. The masked bits n+1, n+2, n+3 do not pass to a dynamic random access memory (DRAM) M connected downstream of the DRAM receiver DR.

In this known method, then, the DQ signal DQ and the DQM signal DQM are transmitted by the memory controller MEMC externally to the DRAM M or the DRAM receiver DR. As a result, the temporal coordination of the signals DQ and DQM is extremely critical and susceptible to changes in the line routing on a printed circuit board ("PCB routing") and also jitter phenomena (voltage fluctuations, CLK or clock instabilities).

Moreover, it should be noted that the line routing for the DQM signal requires additional space and the line routing must be coordinated extremely accurately with the line routing for the DQ signal DQ. In other words, the respective line lengths to be routed for the two signals DQ and DQM must be complied with exactly. All this leads to major problems in modules containing a plurality of DRAMs with a high packing density.

Finally, it should also be considered that additional pins are required in the DRAM receiver DR for the DQM signal DQM, corresponding connectors in the module being made complicated as a result of this.

As can be seen from FIG. 1, in the method according to the invention, the DQ signal, which contains the DQ bits, has two different levels, namely a normal level Le1 and an increased level Le2. During the increased level Le2 between the instants t1 and t2, the bits of the DQ signal are masked. In other words, the masked bits are not read into the DRAM M as shown in FIG. 2.

Figure 2:
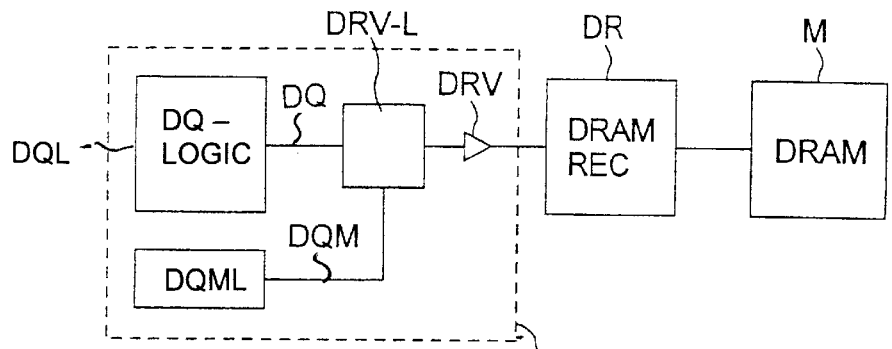
FIG. 2 is a block diagram of a circuit configuration for carrying out the method according to the invention.

As can be seen from FIG. 2, the level Le2 of the DQ signal with the increased voltage V is generated during the time window between the instants t1 and t2 of time t for example by corresponding driving of a driver circuit DRV and a driver logic unit DRV-L. Outside the time window between the instants t1 and t2, the driver logic unit DRV-L drives the driver circuit DRV in such a way that the latter yields the DQ signal with the lower level Le1.

What is essential to the present invention, therefore, is the introduction of two different levels Le1 and Le2 for the DQ signal. If the DQ signal is at the low level Le1, then the bits of the DQ signal are not masked. By contras t, if the DQ signal DQ assumes the increased level Le2, then the bits of the DQ signal are masked.

Since the driver circuit DRV and the driver logic unit DRV-L are contained in the memory controller MEMC, long signal paths for the DQ signal and for the DQM signal are obviated. This practically completely precludes routing problems or problems on account of temporal mismatches of the individual signal paths for the DQ signal DQ and the DQM signal DQM. Moreover, it is possible to obtain high packing densities since practically no additional long signal paths are required for the DQM signal.

In the above exemplary embodiment, the masked bits of the DQ signal assume the increased level Le2. However, it is also possible to provide, for the masked bits, a level lower than the level of the normal signal Le1. All that is important, then, is that the masked bits are marked by a level that deviates from the normal level of the DQ bits.

We claim:

1. A method for masking DQ (data) bits which are input into a semiconductor memory by a memory controller, which comprises the step of:

changing a voltage level of the DQ bits to be masked, during a time window, from a normal voltage level to a deactivating voltage level which deviates from the normal level; and masking the DQ bits having the deactivating voltage level and preventing the DQ bits having the deactivating voltage level from being read into the semiconductor memory.

2. The method according to claim 1, which comprises feeding the DQ bits to be masked to the semiconductor memory with an increased voltage level.

3. The method according to claim 1, which comprises using a dynamic random access memory as the semiconductor memory and the DQ bits are input into the dynamic random access memory.

4. The method according to claim 1, which comprises generating the DQ bits with the deactivating voltage level relative to unmasked DQ bits in a driver circuit with a driver logic unit.

5. The method according to claim 4, which comprises providing the driver circuit and the driver logic unit in the memory controller.

6. A method for masking DQ (data) bits input into a semiconductor memory by a memory controller, which comprises the steps of:

providing a driver circuit and a driver logic unit in the memory controller;

generating the DQ bits to be changed to a deactivating voltage level relative to unmasked DQ bits in the driver circuit with the driver logic unit;

changing a voltage level of the DQ bits to be masked, during a time window, from a normal voltage level to a deactivating voltage level deviating from the normal level; and masking the DQ bits having the deactivating voltage level and preventing the DQ bits having the deactivating voltage level from being read into the semiconductor memory.

* * * * *